US010050613B2

(12) United States Patent
Dakshinamurthy (10) Patent No.: US 10,050,613 B2
(45) Date of Patent: Aug. 14, 2018

(54) PHASE AND AMPLITUDE ADJUSTMENT FOR SENSORS

(71) Applicant: InvenSense, Inc., San Jose, CA (US)

(72) Inventor: Sriraman Dakshinamurthy, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/365,400

(22) Filed: Nov. 30, 2016

(65) Prior Publication Data

US 2018/0152182 A1    May 31, 2018

(51) Int. Cl.
*H03K 3/017*  (2006.01)
*H03K 7/08*   (2006.01)
*H03K 19/21*  (2006.01)
*G01C 19/5776* (2012.01)

(52) U.S. Cl.
CPC ........... *H03K 7/08* (2013.01); *G01C 19/5776* (2013.01); *H03K 19/21* (2013.01)

(58) Field of Classification Search
CPC ....................................................... H03K 7/08
See application file for complete search history.

(56) References Cited

U.S. PATENT DOCUMENTS

2012/0112811 A1* 5/2012 Cook ................... H03K 7/08
                                                    327/175

* cited by examiner

*Primary Examiner* — Daniel Puentes
(74) *Attorney, Agent, or Firm* — Duane Morris LLP; Amir A. Tabarrok (57) ABSTRACT

A device includes a micro-electro-mechanical system (MEMS) sensor and a PWM modifier circuitry. The MEMS sensor may include a drive circuitry and a sense circuitry. The MEMS sensor is configured to sense motion. A carrier signal is used in the sense circuitry and the drive circuitry. The PWM modifier circuitry is configured to generate a PWM modifier signal for modifying a portion of a PWM signal and to form a modified PWM signal to compensate for changes in the carrier signal.

23 Claims, 9 Drawing Sheets

PHASE AND AMPLITUDE ADJUSTMENT FOR SENSORS

BACKGROUND

Accurate amplitude and phase control of a carrier signal is important for sensor processing. Traditionally a high speed clocking mechanism has been used to achieve a high accuracy for amplitude and phase of the carrier signal. However, a high speed clocking mechanism has a high power consumption and thus is not suitable for mobile devices. Conventionally, in-phase and quadrature phase paths have also been used. However, using in-phase and quadrature phase paths not only requires more die space but also requires an in-phase and quadrature phase circuitry, thereby increasing the complexity.

SUMMARY

Accordingly, a need has arisen to achieve high accuracy for phase and amplitude of a carrier signal while maintaining a low power consumption. According to some embodiments, instead of using a high speed clocking mechanism or using an in-phase and quadrature phase paths, a pulse width modulation (PWM) is modified to achieve a high accuracy phase and/or amplitude for the carrier signal at a lower power consumption. In some embodiments, a portion of the PWM signal is modified.

In some embodiments, a device includes a micro-electro-mechanical system (MEMS) sensor and a PWM modifier circuitry. The MEMS sensor includes a drive circuitry and a sense circuitry. The MEMS sensor is configured to sense motion and a carrier signal is used in the sense circuitry and the drive circuitry. In some embodiments, the PWM modifier circuitry is configured to generate a PWM modifier signal for modifying a portion of a PWM signal and to form a modified PWM signal to compensate for changes in the carrier signal.

The device may further include a demodulator configured to receive the modified PWM signal and a sensed signal. The demodulator may be configured to demodulate the sensed signal with the modified PWM signal.

In some embodiments, the PWM signal is sampled with a sampling frequency to form a plurality of sampled PWM signal. The PWM modifier circuitry may include switches configured punch out the PWM signal at a time corresponding to a sampled PWM signal of the plurality of sampled PWM signal.

In some embodiments, the PWM modifier circuitry is configured to apply a voltage at a time corresponding to a sampled PWM signal of the plurality of sampled PWM signal. It is appreciated that in some embodiments the modified PWM signal compensates for changes to an amplitude of the carrier signal. It is appreciated that in some embodiments the modified PWM signal compensates for changes to a phase of the carrier signal.

According to some embodiments, the PWM modifier circuitry may be further configured to modify another portion of the PWM signal. The modifying the another portion of the PWM signal limits even harmonics in the modified PWM, in some embodiments.

The device may further include a logic circuitry configured to receive the PWM signal and the PWM modifier signal and outputs the modified PWM signal. According to one embodiment, the device further includes a sigma delta circuitry configured to periodically adjust a phase associated with the carrier signal.

These and other features and aspects of the concepts described herein may be better understood with reference to the following drawings, description, and appended claims.

DETAILED DESCRIPTION

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

A need has arisen to achieve high accuracy for phase and amplitude of a carrier signal while maintaining a low power consumption. According to some embodiments, instead of using a high speed clocking mechanism or using an in-phase and quadrature phase paths, a pulse width modulation (PWM) is modified to achieve a high accuracy phase and/or amplitude for the carrier signal at a lower power consumption. In some embodiments, a portion of the PWM signal is modified.

Figure 1A:
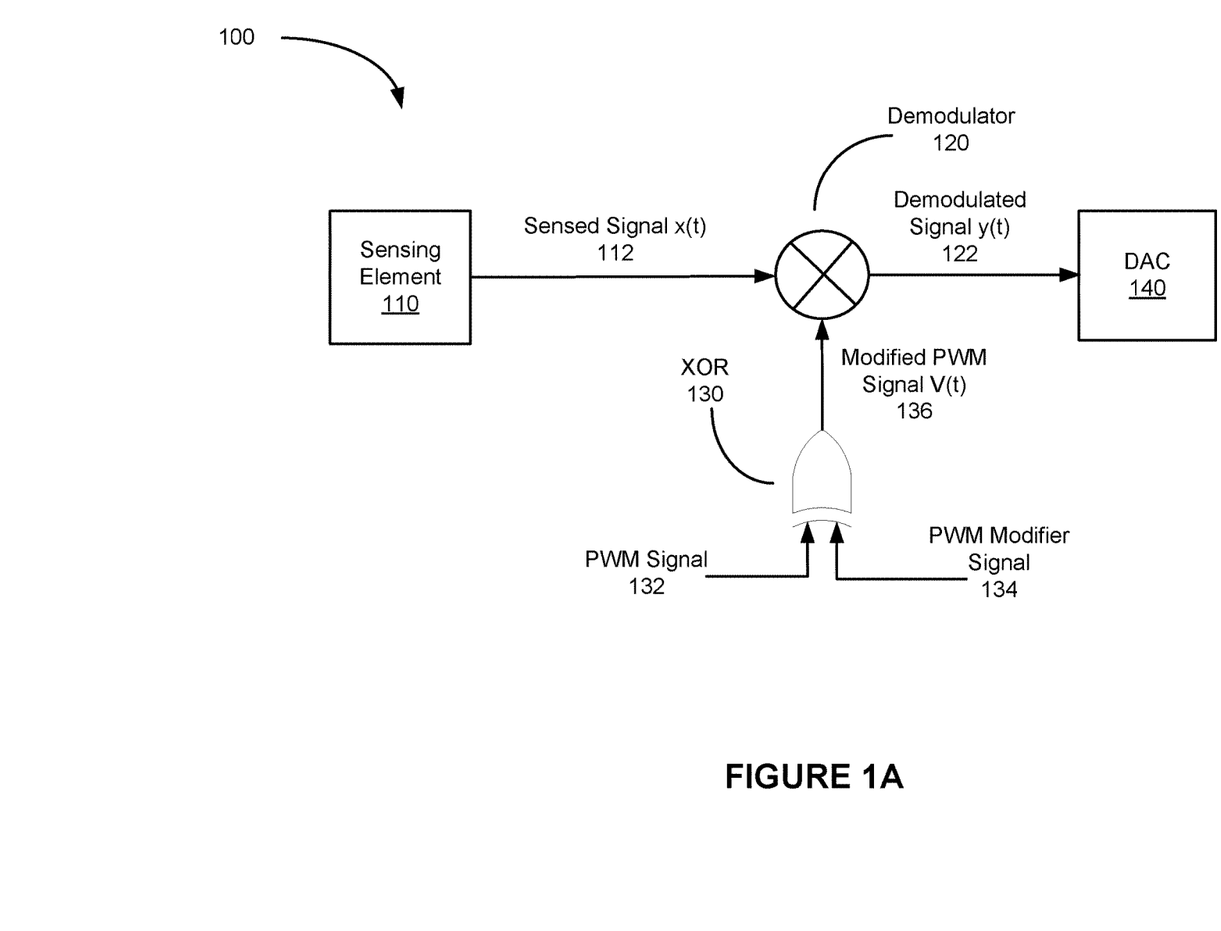
FIGS. 1A-1G show demodulation of a signal with a modified PWM signal and signal diagrams in accordance with some embodiments.

Referring now to FIG. 1A a demodulation of a signal with a modified PWM signal in accordance with some embodiments is shown. Circuit 100 includes a sensing element 110, a demodulator 120, a logic component, e.g., XOR gate 130, and a digital to analog convertor (DAC) 140. It is appreciated that the sensing element may be a micro-electro-mechanical system (MEMS) sensor, e.g., a gyroscope sensor, a motion sensor, etc. In some embodiments, the sensing element 110 may include a drive circuitry (not shown) and a sense circuitry (not shown). It is appreciated that even though the embodiments are described with respect to the sense circuitry and the sensed signal of the sensor, the embodiments are also applicable to the drive circuitry.

According to some embodiments, the sensing element 110 may detect a motion, e.g., movement, rotation, etc. The sensing element 110 may output a sensed signal x(t) 112. The sensed signal 112 is output to the demodulator 120 in order to be demodulated.

In some embodiments, a PWM signal 132 is generated (not shown) and received by a logic component, e.g., XOR gate 130. The XOR gate 130 also receives a PWM modifier signal 134. Generation of the PWM modifier signal 134 is described with respect to FIG. 2-5 below. The PWM modifier signal 134 causes a modification to a portion of the PWM signal 132, e.g., a portion of the phase, a portion of the amplitude, etc., while the remainder of the PWM signal 132 remains unaltered. Modification to only a portion of the PWM signal 132 enables a higher resolution to be achieved without increasing the clock speed, thus without an increase in power consumption. In other words, applying the PWM modifier signal 134 to the PWM signal 132 punches out the PWM signal at a particular position of the PWM signal 132. It is appreciated that the PWM signal 132 may be modified by the PWM modifier signal 134 by applying a voltage (either the same polarity as the PWM signal or opposite polarity) to the PWM signal 132 in order to alter the PWM signal 132. It is appreciated that use of the XOR gate 130 is for exemplary illustration purposes and should not be construed as limiting the scope of the embodiments. For example, other logic components such as an AND gate, OR gate, NOR gate, NAND gate, a multiplier, or any combination thereof may be used.

The XOR gate 130 outputs a modified PWM signal V(t) 136. As such, the demodulator 120 receiving the modified PWM signal V(t) 136 demodulates the sensed signal x(t) 112 based on the modified PWM signal V(t) 136 to form the demodulated signal y(t) 122. It is appreciated that in some embodiments, the demodulated signal y(t) 122 may be input to the DAC 140 to convert the signal to an analog form. Accordingly, the sensed signal x(t) 112 is demodulated with a higher resolution PWM signal (the modified PWM signal V(t) 136) without a need to increase the clock speed or additional circuitry to create in-phase and quadrature phase of the sensed signal. As a result, increased power consumption is avoided, while increasing performance and accuracy of the carrier signal.

Figure 1B:
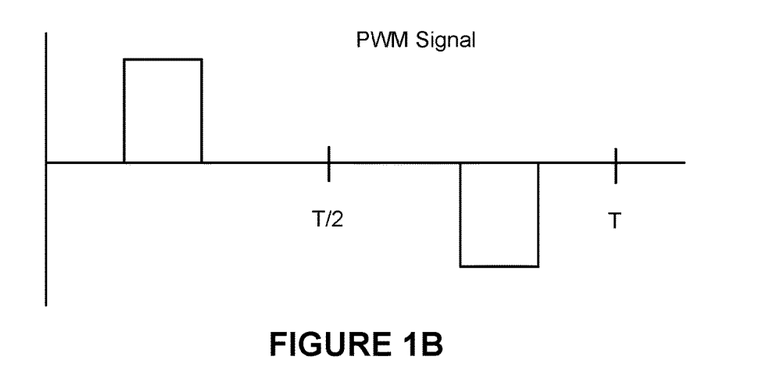
Figure 1C:
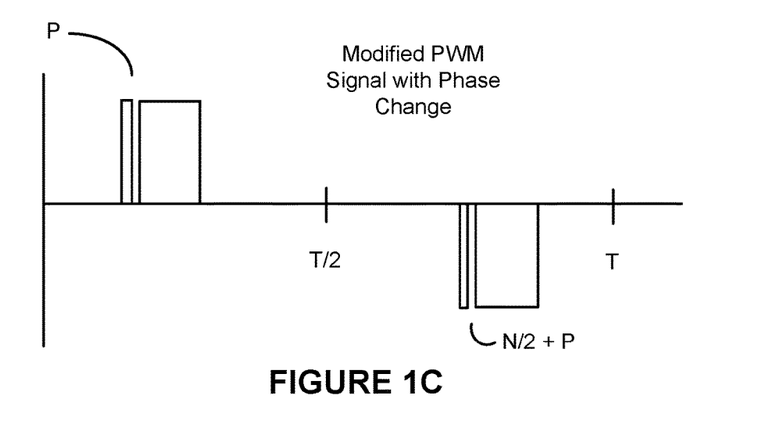

Referring now to FIGS. 1B-1G signal diagrams for a PWM signal and the modified PWM signal in accordance with some embodiments are shown. FIG. 1B illustrates an exemplary PWM signal. FIG. 1C illustrates the modified PWM signal. In this illustration, the PWM signal 132 is punched out (a voltage is applied to the PWM signal) at an index P. As such, the PWM signal 132 is modified at location P while the remainder of the PWM signal 132 remains the same. In this illustrative example, the PWM signal 132 is also punched out at N/2+P in order to keep the symmetry of the PWM signal 132 and in order to limit even harmonics.

According to some embodiments, N corresponds to the number of samples within a period T. It is appreciated that the period T is the period of the carrier signal. In other words, the carrier signal may have a frequency f and it is equal to 1/T. The PWM signal is sampled at a sampling frequency to generate N samples of the PWM signal within one T period. The first sample of the PWM signal is associated with index 1, the second sample of the PWM signal may be associated with index 2, and so forth. The index P may be programmable and it is an integer less than or equal to N/2 and it corresponds to a sampled PWM signal within the first half period T/2. In some embodiments, the index P may be referred to as a demodulation phase index. It is appreciated that the modified PWM signal in FIG. 1C changes the phase of the PWM signal at position P and N/2+P.

Figure 1D:
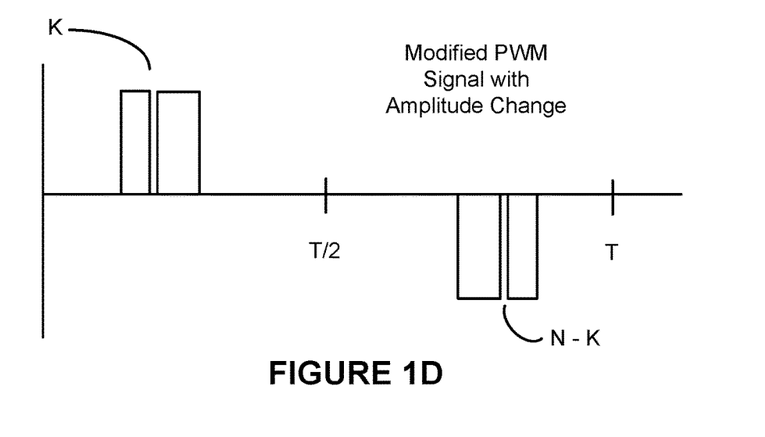

FIG. 1D illustrates the modified PWM signal. In this illustration, the PWM signal 132 is punched out (a voltage is applied to the PWM signal) at an index K. As such, the PWM signal 132 is modified at location K while the remainder of the PWM signal 132 remains the same. In this illustrative example, the PWM signal 132 is also punched out at N-K in order to keep the symmetry of the PWM signal 132 and in order to limit even harmonics.

According to some embodiments, the index K may be programmable and it is an integer less than or equal to N/2 and it corresponds to a sampled PWM signal within the first half period T/2. It is appreciated that the modified PWM signal in FIG. 1D changes the amplitude of the PWM signal at position K and N-K.

Figure 1E:
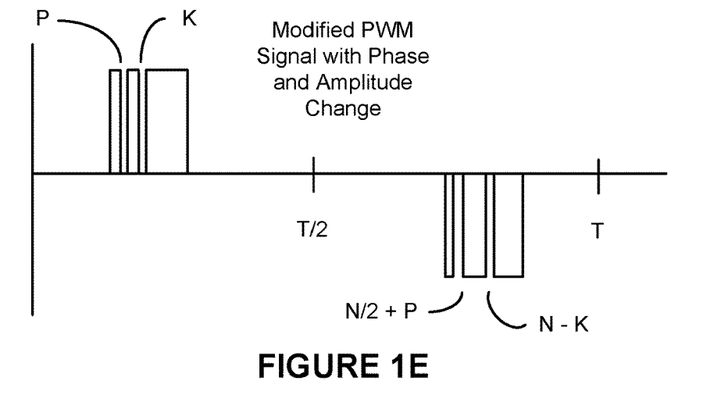
Figure 1F:
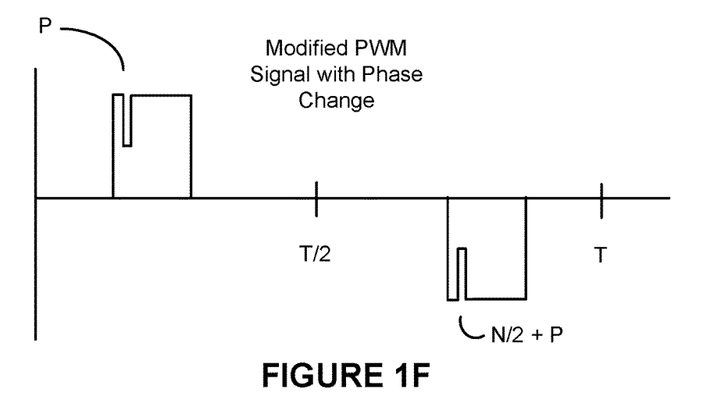

Referring now to FIG. 1E, the punched PWM signal is punched according to FIGS. 1C and 1D in order to modify the amplitude as well as the phase at particular positions of the PWM signal. Referring now to FIG. 1F, a modified PWM signal with a phase change according to some embodiments is shown. In this embodiment, the PWM signal is punched and a voltage is applied at the programmable index P such that the PWM signal is modified at that position resulting in a different magnitude (here a non-zero magnitude) in comparison to the zero magnitude of FIG. 1C. Similarly, the PWM signal may be punched at N/2+P to maintain symmetry and to limit even harmonics.

Figure 1G:
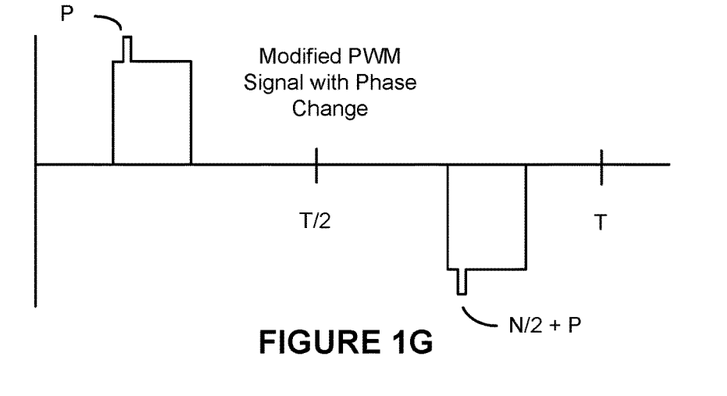

Referring now to FIG. 1G, a modified PWM signal with a phase change according to some embodiments is shown. In this embodiment, the PWM signal is punched and a voltage is applied at the programmable index P such that the PWM signal is modified at that position resulting in a different magnitude (here a non-zero magnitude) in comparison to the zero magnitude of FIG. 1C. Similarly, the PWM signal may be punched at N/2+P to maintain symmetry and to limit even harmonics.

It is appreciated that while FIGS. 1F and 1G illustrate punching out of the PWM signal to change the phase of the PWM signal at the index P position and N/2+P position, similar punching out techniques may be used to change the amplitude of the PWM at the index K position and N-K position. As such, discussion of punching out techniques in FIGS. 1F-1G are for illustrative purposes and are equally applicable to punching out techniques to modify the amplitude.

Figure 2A:
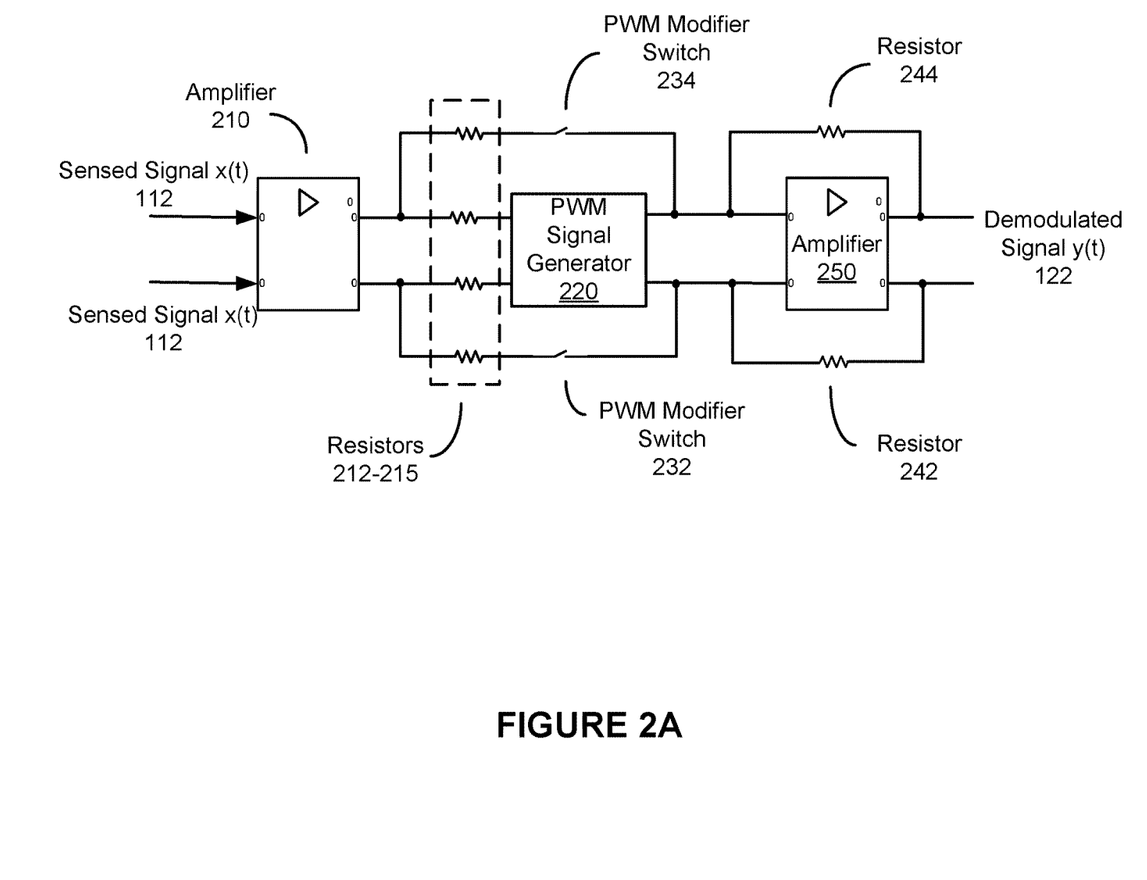
FIGS. 2A and 2B show a demodulation of a signal in accordance with some embodiments.

Referring now to FIG. 2A, a demodulation of a signal in accordance with some embodiments is shown. According to some embodiments, the sensed signal x(t) 112 may be amplified using amplifier 210. The output of the amplifier 210 goes through electrical components having a resistance and illustratively shown as resistors 212-215. A PWM signal generator 220 may receive the amplified sensed signal and it may generate a PWM signal 132 (discussed above). According to some embodiments, a sigma delta circuitry may be coupled to the input of the PWM signal generator 220 to periodically adjust the phase correction applied to the carrier signal. The amplified sensed signals may go through two parallel paths to the PWM signal generator 220. A lower parallel path includes a PWM modifier switch 232 and the upper parallel path includes a PWM modifier switch 234. It is appreciated that the upper parallel path may change the phase of the PWM signal and the lower parallel path may change the amplitude of the PWM signal or vice versa.

According to some embodiments, the closing and opening of the PWM modifier switches 232 and 234 punches out the PWM signal generated by the PWM signal generator 220 at programmable positions, e.g., as shown in FIGS. 1B-1G. Once the PWM signal is punched out, a modified PWM signal is formed and transmitted to a second amplifier 250. The amplifier 250 may amplify the modified PWM signal. It is appreciated that the amplifier 250 may have two parallel paths comprising a resistors 242 and 244 respectively. The amplifier 250 demodulates that sensed signal 112 based on the modified PWM signal, as controlled by the PWM modifier switches 232-234, to form the demodulated signal y(t) 122.

Figure 2B:
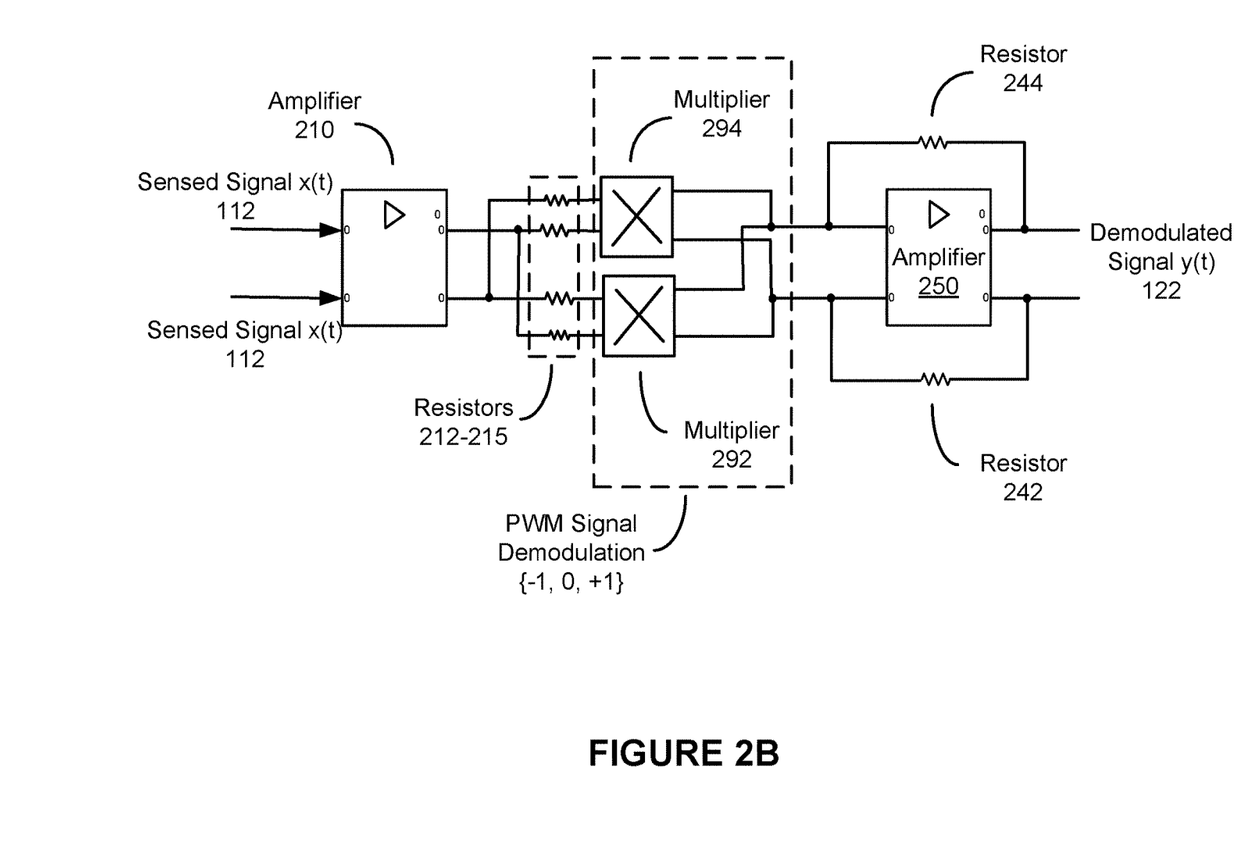

Referring now to FIG. 2B, an alternative implementation for demodulation of a signal in accordance with some embodiments is shown. FIG. 2B is substantially similar to that of FIG. 2A except that the PWM signal generator 220 is replaced with multipliers 292 and 294.

Figure 3:
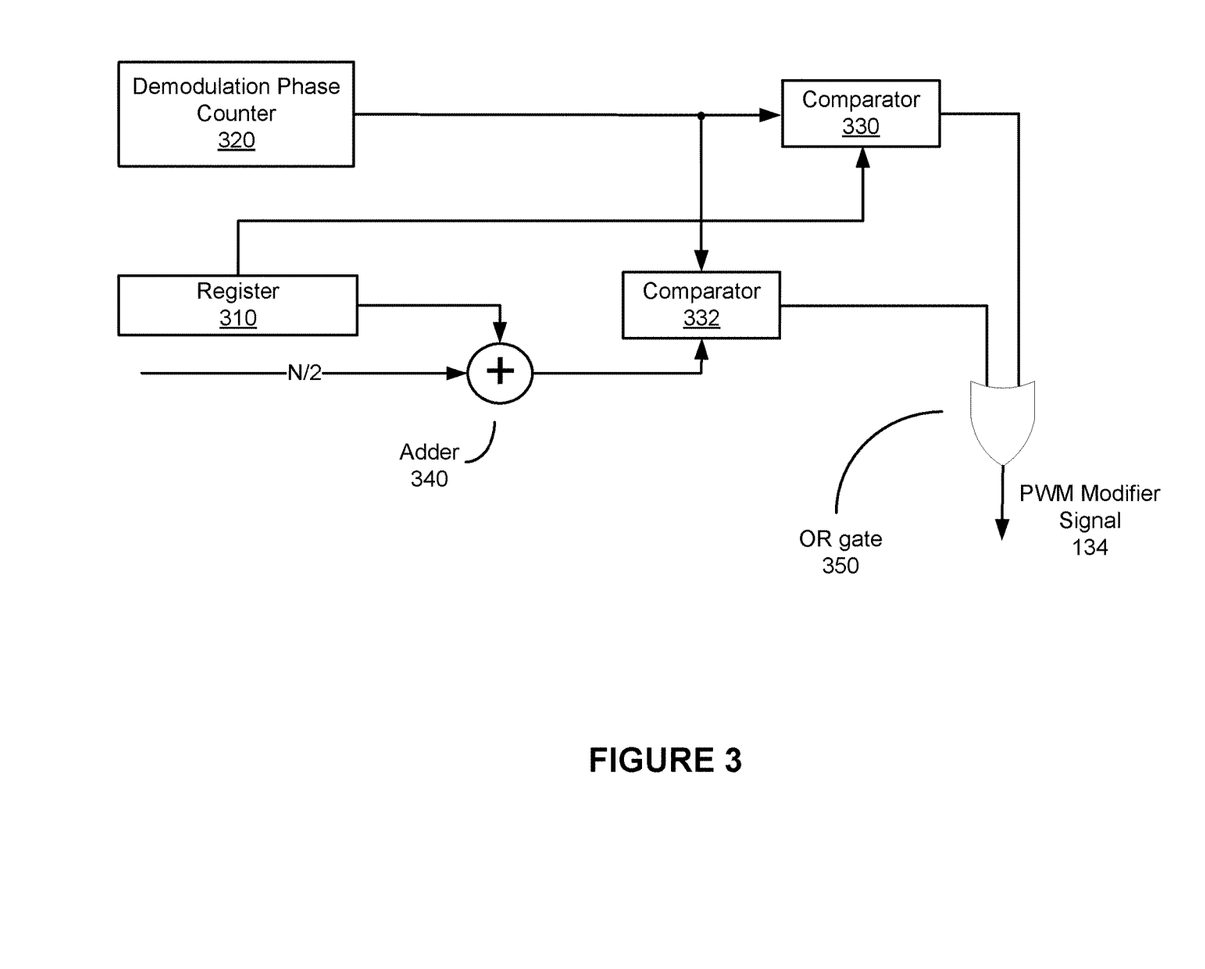
FIG. 3 shows a PWM modifier circuit for changing a phase of a portion of the PWM signal in accordance with some embodiments.

Referring now to FIG. 3, a PWM modifier circuit for changing a phase of a portion of the PWM signal in accordance with some embodiments is shown. The PWM modifier circuit may include a memory component, e.g., a register 310, a demodulation phase counter 320, comparators 330 and 332, an adder 340, and a logic component, e.g., OR gate 350. In some embodiments, the register 310 may store the programmable index where the PWM signal is to be modified, e.g., portion of the PWM signal where the phase is to be modified. It is appreciated that the programmable index may be programmable or it may dynamically be determined based on the performance of the device.

The demodulation phase counter 320 may count the number of samples within a period of the PWM signal. In other words, the demodulation phase counter 320 may count the index associated with the sampled PWM signal. For example, the demodulation counter 320 may count 3 if the third sampled PWM signal is received. The comparator 330 compares the programmable index stored in the register 310 to the value of the demodulation phase counter 320. If the two values are equal to one another, it is determined that the sampled PWM signal is the position where the PWM signal is to be modified or punched out. As such, in some embodiments, the comparator 330 may assert a signal indicating that the PWM signal is to be modified in response to the value of the counter 320 being equal to the programmable index stored in the register 310. In other words, the comparison performed by the comparator 330 indicates that the sampled PWM signal is at position P and therefore is to be punched out at that position.

In an optional embodiment, in order to maintain symmetry of the PWM signal and in order to limit even harmonics of the PWM signal, a similar punch out technique is repeated after N/2 (the second half of the period T). Accordingly, N/2 is summed with the programmable index and compared by comparator 332 to the value of the counter 320. If the comparator 332 determines that the two values are equal, then it outputs a signal indicating that the PWM signal is to be modified. In other words, the comparison performed by the comparator 332 indicates that the sampled PWM signal is at position N/2+P and therefore is to be punched out at that position.

According to some embodiments, the outputs of the comparators 330 and 332 are input to the logic OR gate 350. The output of the OR gate 350 is the PWM modifier signal 134. As such, if any of the outputs of the comparators 330 or 332 is high indicating that the PWM signal is to be punched out, the output of the logic OR gate 350 is high and causes the PWM signal to be punched out.

It is appreciated that the configuration and the number of components illustrated in FIG. 3 is for illustrative purposes only and should not be construed as limiting the scope of the embodiments. As such, other configurations and components may be used to generate the PWM modifier signal 134.

Figure 4:
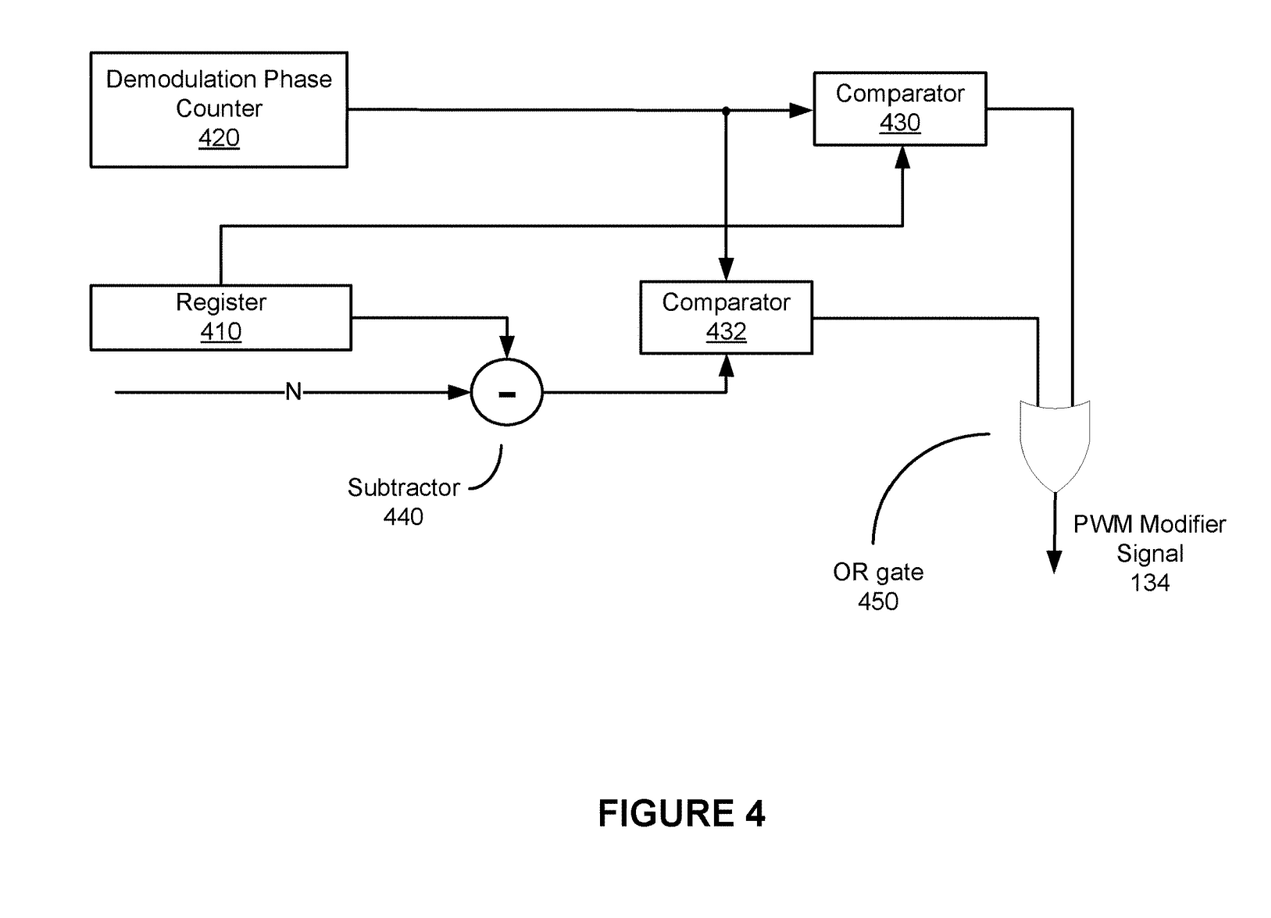
FIG. 4 shows a PWM modifier circuit for changing an amplitude of a portion of the PWM signal in accordance with some embodiments.

Referring now to FIG. 4, a PWM modifier circuit for changing an amplitude of a portion of the PWM signal in accordance with some embodiments is shown. The PWM modifier circuit may include a memory component, e.g., a register 410, a demodulation phase counter 420, comparators 430 and 432, a subtractor 440, and a logic component, e.g., OR gate 450. In some embodiments, the register 410 may store the programmable index where the PWM signal is to be modified, e.g., portion of the PWM signal where the phase is to be modified. It is appreciated that the programmable index may be programmable or it may dynamically be determined based on the performance of the device.

The demodulation phase counter 420 may count the number of samples within a period of the PWM signal. In other words, the demodulation phase counter 420 may count the index associated with the sampled PWM signal. For example, the demodulation counter 420 may count 5 if the fifth sampled PWM signal is received. The comparator 430 compares the programmable index stored in the register 410 to the value of the demodulation phase counter 420. If the two values are equal to one another, it is determined that the sampled PWM signal is the position where the PWM signal is to be modified or punched out. As such, in some embodiments, the comparator 430 may assert a signal indicating that the PWM signal is to be modified in response to the value of the counter 420 being equal to the programmable index stored in the register 410. In other words, the comparison performed by the comparator 430 indicates that the sampled PWM signal is at position K and therefore is to be punched out at that position.

In an optional embodiment, in order to maintain symmetry of the PWM signal and in order to limit even harmonics of the PWM signal, a similar punch out technique is repeated after N/2 (the second half of the period T). Accordingly, the programmable index is subtracted from value N using the subtractor 440 and compared by comparator 432 to the value of the counter 420. If the comparator 432 determines that the two values are equal, then it outputs a signal indicating that the PWM signal is to be modified. In other words, the comparison performed by the comparator 432 indicates that the sampled PWM signal is at position N-K and therefore is to be punched out at that position.

According to some embodiments, the outputs of the comparators 430 and 432 are input to the logic OR gate 450. The output of the OR gate 450 is the PWM modifier signal 134. As such, if any of the outputs of the comparators 430 or 432 is high indicating that the PWM signal is to be punched out, the output of the logic OR gate 450 is high and causes the PWM signal to be punched out.

It is appreciated that the configuration and the number of components illustrated in FIG. 4 is for illustrative purposes only and should not be construed as limiting the scope of the embodiments. As such, other configuration and components may be used to generate the PWM modifier signal 134.

Figure 5:
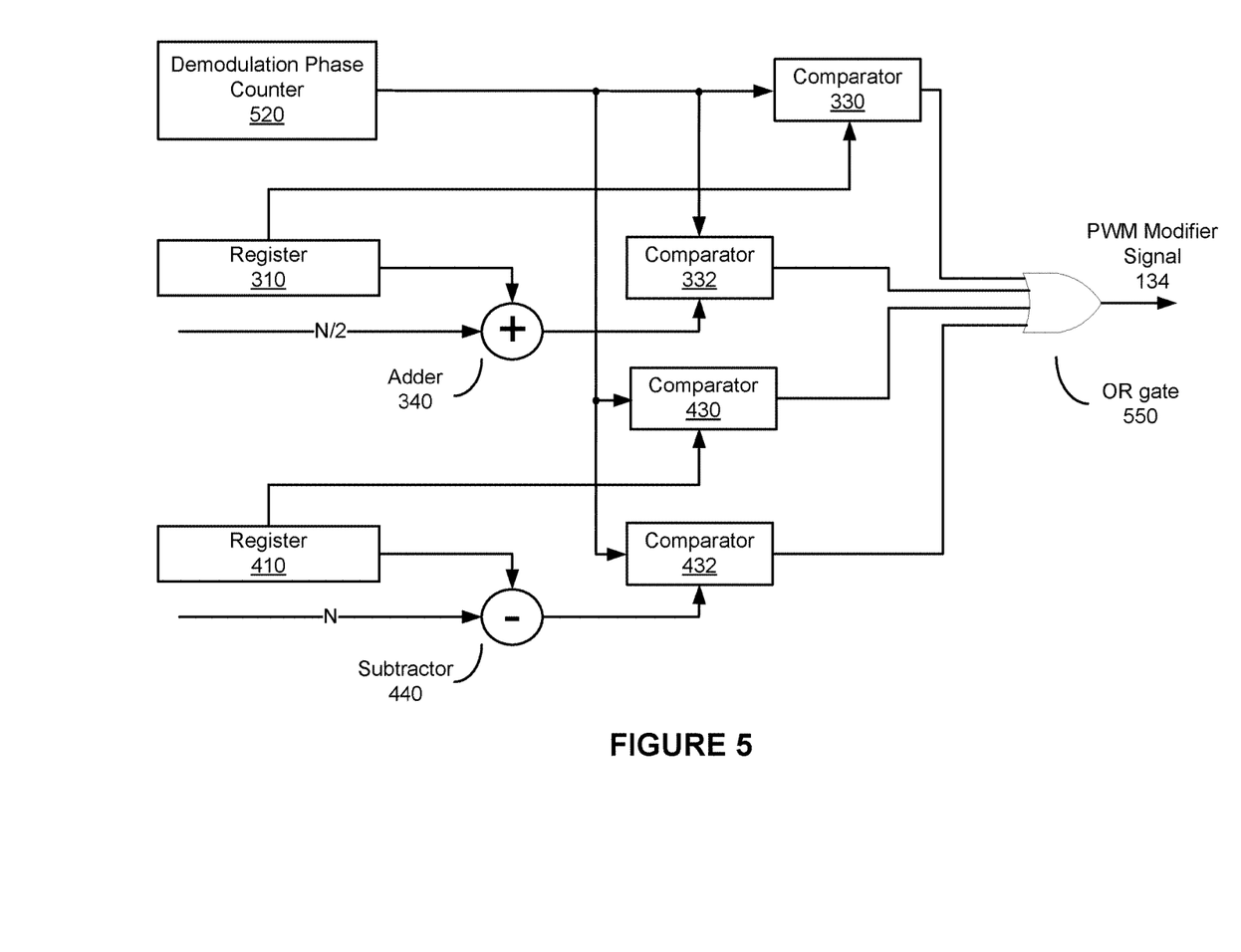
FIG. 5 shows a PWM modifier circuit for changing a phase and an amplitude of a portion of the PWM signal in accordance with some embodiments.

Referring now to FIG. 5, a PWM modifier circuit for changing a phase and an amplitude of a portion of the PWM signal in accordance with some embodiments is shown. In this embodiment, the circuitries of FIGS. 3 and 4 are combined. It is appreciated that the demodulation phase counter 520 operates similar to that of FIGS. 3 and 4. The programmable indices, e.g., P and K, may be stored in registers 310 and 410 respectively. The comparators 330-332, 430, and 432 and the adder 340 and the subtractor 440 operate in a similar fashion that were described in FIGS. 3 and 4. The output of the comparators 330, 332, 430, and 432 are input to a 4 input OR gate 550. The output of the OR gate 550 is the PWM modifier signal 134. As such, if any of the outputs of the comparators 330, 332, 430, or 432 is high indicating that the PWM signal is to be punched out, the output of the logic OR gate 550 is high and causes the PWM signal to be punched out.

It is appreciated that the configuration and the number of components illustrated in FIG. 5 are for illustrative purposes only and should not be construed as limiting the scope of the embodiments. For example, instead of using registers 310 and 410, one register storing both indices may be used. As such, other configurations and components may be used to generate the PWM modifier signal 134.

Figure 6:
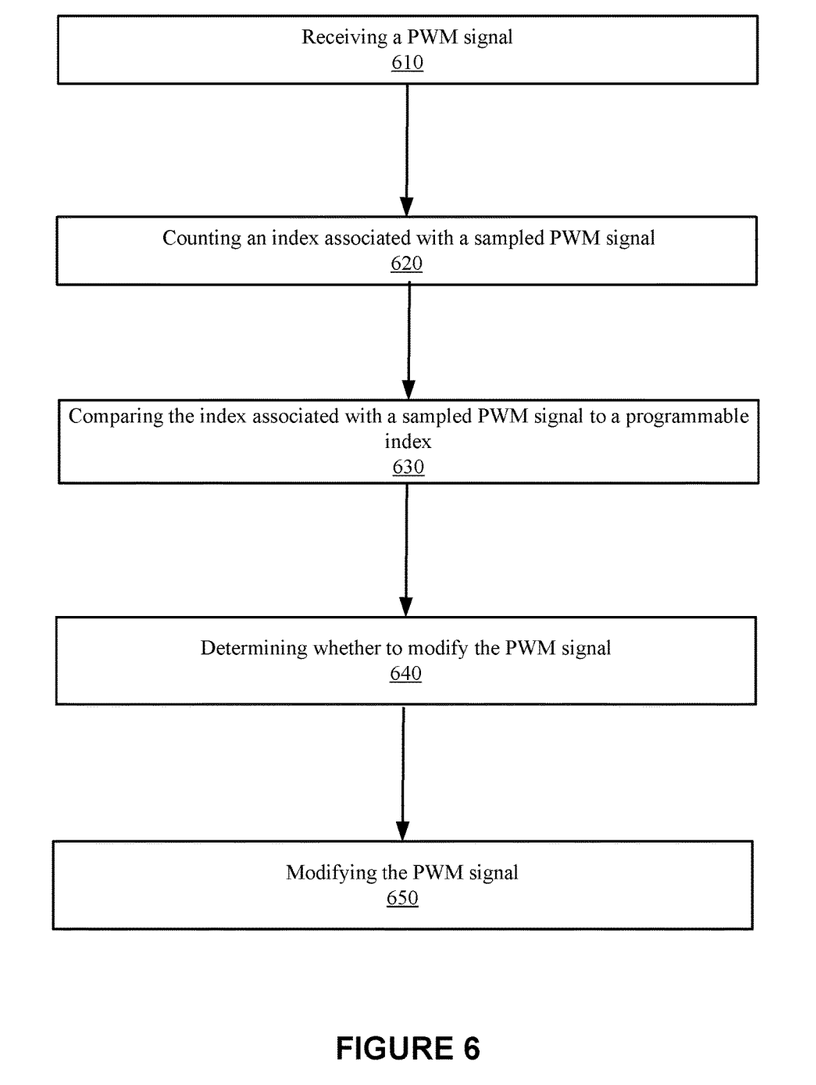
FIG. 6 shows a flow diagram modifying a portion of the PWM signal in accordance with some embodiments.

Referring now to FIG. 6, a flow diagram modifying a portion of the PWM signal in accordance with some embodiments is shown. At step 610, a PWM signal is received. At step 620, an index associated with a sampled PWM signal is counted (for example according to FIGS. 3-5). For example, a counter may count to determine the index to the corresponding sampled PWM signal. At step 630, the index associated with the sampled PWM signal counted by the counter is compared to a programmable index (according to FIGS. 3-5). At step 640, it is determined based on the comparison whether the PWM signal is to be punched out at the counted location (according to FIG. 3-5). At step 650, the PWM signal is punched out at the counted location based on the determination at step 640 (according to FIGS. 1-5). It is appreciated that punch out of the PWM signal forms the modified PWM signal that has a higher resolution and it adjusts and compensates for changes, e.g., amplitude, phase, etc., in the carrier signal. The modified PWM signal is modified only at a portion of the PWM signal. It is further appreciated that the punch out of the PWM signal achieves a higher accuracy of the carrier signal without increasing power consumption and without increasing circuitry footprint on the board.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A device comprising:
    a sensor configured to sense motion and output a sensed signal;
    a pulse width modulator (PWM) generator configured to generate a single PWM signal, wherein the single PWM signal is sampled with a sampling frequency to form a plurality of samples;
    a PWM modifier circuitry configured to generate a PWM modifier signal for modifying a portion of the single PWM signal and to form a modified PWM signal to compensate for changes in a carrier signal, wherein the PWM modifier circuitry is configured to apply a voltage at a time corresponding to a sampled PWM signal of the plurality of samples; and
    a demodulator configured to receive the modified PWM signal and the sensed signal, wherein the demodulator is further configured to demodulate the sensed signal with the modified PWM signal.

2. The device as described by claim 1, wherein the single PWM signal is sampled with a sampling frequency to form a plurality of samples, and wherein the PWM modifier circuitry comprises switches configured to punch out the single PWM signal at a time corresponding to a sampled PWM signal of the plurality of samples by applying a voltage to the single PWM signal.

3. The device as described by claim 1, wherein the modified PWM signal compensates changes to an amplitude of the carrier signal.

4. The device as described by claim 3, wherein the single PWM signal is sampled with a sampling frequency to form a plurality of samples, and wherein the PWM modifier circuitry comprises:
    a counter configured to count an index associated with a sampled PWM signal of the plurality of samples;
    a comparator configured to compare the index associated with the sampled PWM signal of the plurality of samples to a programmable index; and
    a logic circuitry configured to receive an output of the comparator, wherein the logic circuitry outputs the PWM modifier signal that modifies the plurality of samples at the index associated with the sampled PWM signal of the plurality of samples responsive to the index associated with the sampled PWM signal of the plurality of samples being equal to the programmable index, and wherein the logic circuitry outputs the PWM modifier signal that modifies the plurality of samples at a difference between a number of samples within a period of the single PWM signal and the index associated with the sampled PWM signal of the plurality of samples in response to the difference between the number of samples and the index associated with the sampled PWM signal of the plurality of samples being equal to the programmable index.

5. The device as described by claim 1, wherein the modified PWM signal compensates changes to a phase of the carrier signal.

6. The device as described by claim 5, wherein the single PWM signal is sampled with a sampling frequency to form a plurality of samples, and wherein the PWM modifier circuitry comprises:
    a counter configured to count an index associated with a sampled PWM signal of the plurality of samples;

a comparator configured to compare the index associated with the sampled PWM signal of the plurality of samples to a programmable index; and a logic circuitry configured to receive an output of the comparator, wherein the logic circuitry outputs the PWM modifier signal that modifies the plurality of samples at the index associated with the sampled PWM signal of the plurality of samples responsive to the index associated with the sampled PWM signal of the plurality of samples being equal to the programmable index, and wherein the logic circuitry outputs the PWM modifier signal that modifies the plurality of samples at a sum of the index associated with the sampled PWM signal of the plurality of samples and a half of a number of samples within a period of the single PWM signal in response to the sum of the index associated with the sampled PWM signal of the plurality of samples and a half of the number of samples being equal to the programmable index.

7. The device as described by claim 1, wherein the PWM modifier circuitry is further configured to modify another portion of the single PWM signal, wherein modifying the another portion of the single PWM signal limits even harmonics in the modified PWM.

8. The device as described by claim 1, wherein the PWM modifier circuitry further comprises:
a logic circuitry configured to receive the single PWM signal and the PWM modifier signal and outputs the modified PWM signal.

9. The device as described by claim 1 further comprising:
a sigma delta circuitry coupled to an input of the PWM generator, wherein the sigma delta circuitry is configured to periodically adjust a phase associated with the carrier signal.

10. The device as described by claim 1, wherein the sensor is a micro-electro-mechanical system selected from a group comprising a gyroscope and a motion sensor.

11. A device comprising:
a micro-electro-mechanical system (MEMS) sensor comprising a drive circuitry and a sense circuitry, wherein the MEMS sensor is configured to sense motion, wherein a carrier signal is used in the sense circuitry and the drive circuitry; and
a pulse width modulation (PWM) modifier circuitry configured to generate a PWM modifier signal for modifying a portion of a single PWM signal and to form a modified PWM signal to compensate for changes in the carrier signal, wherein the single PWM signal is sampled with a sampling frequency to form a plurality of samples, and wherein the PWM modifier circuitry is configured to apply a voltage at a time corresponding to a sampled PWM signal of the plurality of samples.

12. The device as described by claim 11 further comprising:
a demodulator configured to receive the modified PWM signal and a sensed signal, wherein the demodulator is further configured to demodulate the sensed signal with the modified PWM signal.

13. The device as described by claim 11, wherein the single PWM signal is sampled with a sampling frequency to form a plurality of samples, and wherein the PWM modifier circuitry comprises switches configured to punch out the single PWM signal at a time corresponding to a sampled PWM signal of the plurality of samples by applying a voltage to the PWM signal.

14. The device as described by claim 11, wherein the modified PWM signal compensates for changes to an amplitude of the carrier signal.

15. The device as described by claim 11, wherein the modified PWM signal compensates for changes to a phase of the carrier signal.

16. The device as described by claim 11, wherein the PWM modifier circuitry is further configured to modify another portion of the single PWM signal, wherein modifying the another portion of the single PWM signal limits even harmonics in the modified PWM.

17. The device as described by claim 11, wherein the PWM modifier circuitry further comprises:
a logic circuitry configured to receive the single PWM signal and the PWM modifier signal and outputs the modified PWM signal.

18. The device as described by claim 11 further comprising:
a sigma delta circuitry configured to periodically adjust a phase associated with the carrier signal.

19. A method comprising:
receiving a pulse width modulation (PWM) signal; and
modifying a portion of the single PWM signal to form a modified PWM signal, wherein the modified PWM signal compensates for changes in a carrier signal used in a micro-electro-mechanical system (MEMS) sensor, wherein the modifying comprises applying a voltage at a time corresponding to a sampled PWM signal of a plurality of samples.

20. The method as described by claim 19, wherein the modifying comprises:
punching out the single PWM signal at a time corresponding to a sampled PWM signal of a plurality of samples by applying a voltage to the single PWM signal.

21. The method as described by claim 19, wherein the modifying changes a phase or amplitude of the portion of the single PWM signal.

22. The method as described by claim 19 further comprising:
counting an index associated with a sampled PWM signal of a plurality of samples;
comparing the index associated with the sampled PWM signal of the plurality of samples to a programmable index;
responsive to the comparing, determining whether to modify the sampled PWM signal of the plurality of samples; and
responsive to determining that the sampled PWM signal is to be modified, modifying the sampled PWM signal.

23. The method as described by claim 22 further comprising:
subsequent to the modifying the sampled PWM signal, modifying another sample PWM signal of the plurality of samples to limit even harmonics in the modified PWM.

* * * * *